US 6,556,029 B1

(12) United States Patent
Min et al.

(10) Patent No.: US 6,556,029 B1
(45) Date of Patent: Apr. 29, 2003

(54) PULSED SINGLE CONTACT OPTICAL BEAM INDUCED CURRENT ANALYSIS OF INTEGRATED CIRCUITS

(75) Inventors: Chin Jiann Min, Singapore (SG); Sivaramakrishna Kolachina, Stafford, TX (US); Jacob C. H. Phang, Singapore (SG); Daniel S. H. Chan, Singapore (SG)

(73) Assignee: National University of Singapore (SG)

( * ) Notice: Subject to any disclaimer, the term of this patent is extended or adjusted under 35 U.S.C. 154(b) by 270 days.

(21) Appl. No.: 09/630,252

(22) Filed: Aug. 1, 2000

(51) Int. Cl.$^7$ .............................................. G01R 31/305
(52) U.S. Cl. ....................... 324/751; 324/750; 324/158.1
(58) Field of Search ................................. 324/750, 765, 324/762, 501, 751, 158.1; 250/310, 311; 438/14, 17, 18

(56) References Cited

U.S. PATENT DOCUMENTS

| | | | |
|---|---|---|---|
| 5,162,240 A | * 11/1992 | Saitou et al. | 382/145 |
| 5,422,498 A | * 6/1995 | Nikawa et al. | 257/431 |
| 5,430,305 A | * 7/1995 | Cole et al. | 250/559.07 |
| 5,951,891 A | * 9/1999 | Barenboim et al. | 219/121.68 |
| 6,031,217 A | * 2/2000 | Aswell et al. | 250/208.1 |

\* cited by examiner

Primary Examiner—Kamand Cuneo
Assistant Examiner—Tung X. Nguyen

(74) Attorney, Agent, or Firm—David Jaffer; Pillsbury Winthrop LLP

(57) ABSTRACT

An improved method of performing optical beam induced current imaging of semiconductor junctions. According to the method, a single wired contact to an integrated circuit (for example through use of a conventional conductive probe) is made at a point that makes electrical contact to a first side of a junction to be analyzed. A first line connects the wired contact to an amplifier, and a second line carries return current from the amplifier to a ground connection. A capacitive return connection is then used to couple return current from a second side of the junction to ground. The actual value of capacitance in the return connection is not of fundamental importance in the practice of the invention, but generally larger capacitance values are preferred and allow increased induced current flow. An increase in the optical beam power also results in more induced current being generated. This causes a faster decay and results in a better signal-to-noise ratio at a higher scanning beam rate. With the connections described above to the amplifier and the processing circuitry, a pulsed particle or optical beam is applied to the junction. In response to the pulsed beam, the junction generates a corresponding pulse of induced current. Since the current in response to the pulsed beam has an alternating current component, it passes through the capacitive junction return connection as well as through the single wired contact to the amplifier. The amplifier outputs a magnified replica of the current which is then analyzed by the processing circuit to provide a useful form of data for analysis of the junction.

22 Claims, 3 Drawing Sheets

PULSED SINGLE CONTACT OPTICAL BEAM INDUCED CURRENT ANALYSIS OF INTEGRATED CIRCUITS

BACKGROUND OF THE INVENTION

1. Field of the Invention

The present invention relates generally to methods and apparatus for optical beam induced current investigation in integrated circuits, and more particularly to a method and apparatus for optical beam induced current investigation that requires only one contact with the circuit through use of intrinsic system capacitance as an electrical return path.

2. Brief Description of the Prior Art

It is well known in the art that if an optical beam impinges on a semiconductor junction, a current will be generated by the junction. The current is due to a built-in potential in every semiconductor junction as a result of band bending. This phenomena has been used extensively to image semiconductor junctions in the areas of general semiconductor device analysis and semiconductor failure analyses. Prior art methods require the connection of both ends of a junction to a direct current/low frequency current detection and processing circuitry. Due to the difficulty in making these connections on the interior of an integrated circuit, it is impractical or impossible to analyze junctions that do not have both ends connected to lines leading to external contacts.

The problem is illustrated in FIG. 1. An integrated circuit 10 is shown with two diodes 12 and 14 symbolically represented. Diode 12 has both ends connected to lines leading to external contacts 16 and 18 that can be easily accessed for analysis. In contrast, the ends of diode 14 do not connect to an "external" contact. In order to analyze diode 14, prior art methods require the use of probes 20 and 22. Positioning these probes is a very precise and time consuming operation and therefore undesirable.

FIG. 1 also illustrates the prior art process of imaging. An optical beam 24 of constant signal strength is shown impinging on diode 14. In response, diode 14 generates a current that flows through conductor 26 to the current amplifier circuit 28 and back through return line 30. The output 32 of the amplifier 28 is then received by the signal processor 34 wherein the signal is detected, and in response the processor provides an output indicative of the current and corresponding junction status.

From the above description of the prior art, it is apparent that there is a need for an improved method and apparatus for imaging junctions that are located on the interior of an integrated circuit.

SUMMARY OF THE INVENTION

It is therefore an object of the present invention to provide an improved method and apparatus for performing optical beam induced current imaging of semiconductor junctions.

It is a further object of the present invention to provide a method and apparatus for performing optical beam induced current imaging of semiconductor junctions located interior on integrated circuits without the need for probing of interior portions of the circuit.

It is a still further object of the present inventions to provide an improved method and apparatus for performing optically induced current imaging of semiconductor junctions that require only a single wired contact with the integrated circuit.

Briefly, a preferred embodiment of the present invention includes an improved method of performing optical beam induced current imaging of semiconductor junctions. According to the method, a single wired contact to an integrated circuit (for example through use of a conventional conductive probe) is made at a point that makes electrical contact to a first side of a junction to be analyzed. A first line connects the wired contact to an amplifier, and a second line carries return current from the amplifier to a ground connection. A capacitive return connection is then used to couple return current from a second side of the junction to ground. The actual value of capacitance in the return connection is not of fundamental importance in the practice of the invention, but generally larger capacitance values are preferred and allow increased induced current flow. With the connections described above to the amplifier and the processing circuitry, a pulsed optical beam is applied to the junction. In response to the pulsed beam, the junction generates a corresponding pulse of induced current. Since the current in response to the pulsed beam has an alternating current component, it passes through the capacitive junction return connection as well as through the single wired contact to the amplifier. The amplifier outputs a magnified replica of the current which is then analyzed by the processing circuit to provide a useful form of data for analysis of the junction.

An advantage of the present invention is that it provides a method and apparatus for rapid performance of optical beam induced current imaging of semiconductor junctions.

Another advantage of the present invention is that it avoids the need to probe individual junctions on an integrated circuit in order to perform optical beam induced current imaging.

A further advantage of the present invention is that it substantially reduces the labor and corresponding cost of performing optical beam induced current imaging of semiconductor junctions on an integrated circuit.

IN THE DRAWING

FIG. 4a illustrates a preferred modulated beam configuration;

FIG. 4b illustrates a typical current generated by a semiconductor junction in response to the pulsed beam illustrated in FIG. 4a.

DETAILED DESCRIPTION OF THE PREFERRED EMBODIMENT

Figure 1:
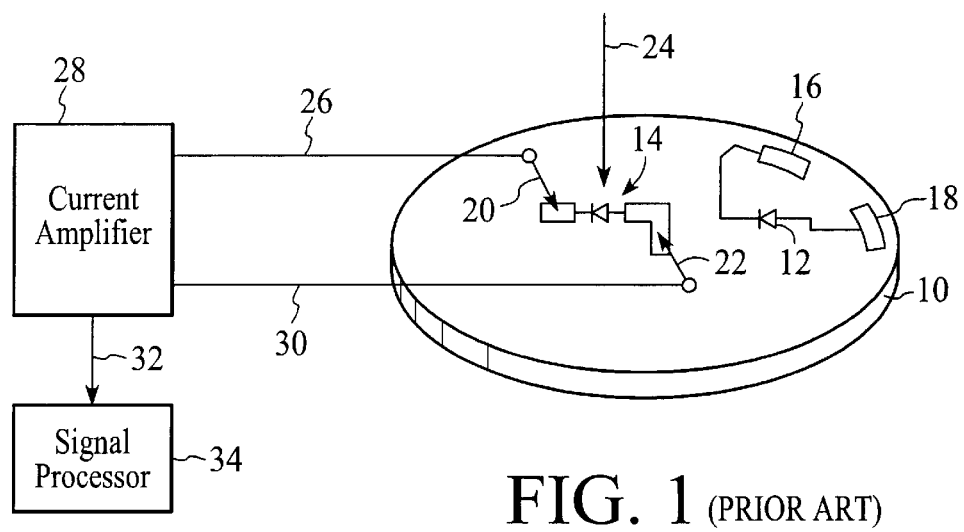
FIG. 1 illustrates a prior art method involving probing of semiconductor interior junctions on an integrated circuit.
Figure 2:
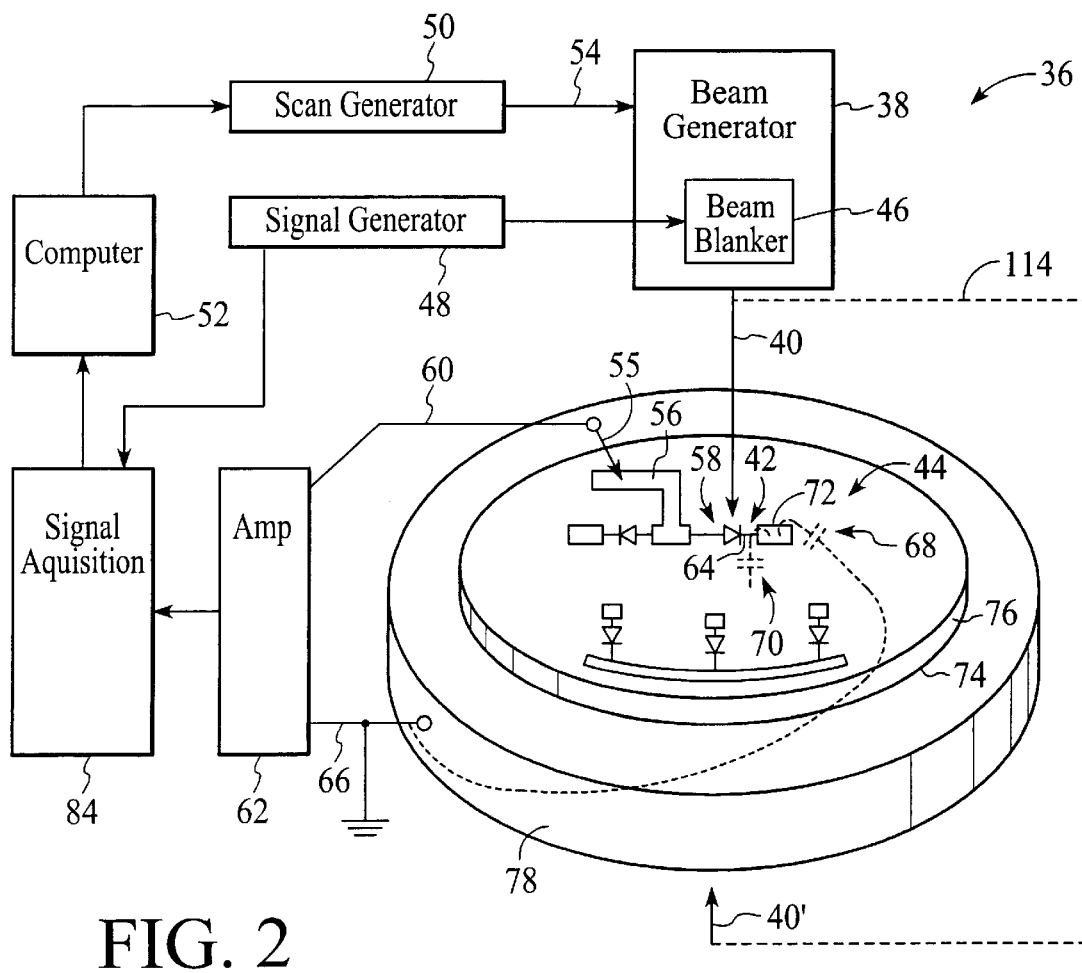
FIG. 2 is a diagram illustrating a preferred embodiment of the present invention.

A preferred embodiment of the present invention is illustrated in FIG. 2 including a pulsed beam apparatus 36 for performing beam induced current analysis of semiconductor junctions. The apparatus includes an optical beam generator 38 for applying a pulsed beam 40 to a selected semiconductor junction such as diode 42 on an integrated circuit 44. The generator 38 includes a beam blanker 46 for turning the beam on and off in response to input from a signal generator 48. A scan generator 50 receives directive input from a programmed computer 52 for the purpose of providing drive signals at 54 to cause the beam generator 38 to position the beam 40 in alignment with the coordinates of a particular semiconductor junction such as diode 42. In response to the pulsed beam 40 impinging upon it, the diode 42 responds by generating an induced current with an alternating current component that will flow through a completed circuit having a series capacitive component. According to the present invention the circuit includes a single physical wired/probed electrical contact to any conductive portion of the integrated circuit 44 that leads to either side of a selected diode. The use of the term "wired contact" will include a direct current conductive line, which is the preferred embodiment, and will also include any other line with a broad bandwidth capability which would include a line with a large series capacitor that would not significantly limit the flow of induced current.

For illustrative purposes, diode 42 of FIG. 2 is selected. A single contact 55 is shown conveniently connected to a line 56 that makes electrical contact with one side 58 of diode 42. The contact 55 connects to line 60 from amplifier 62. According to the present invention the completed circuit, for flow of induced current from diode 42, also includes any and all capacitance in the circuit from the other side 64 of diode 42 to line 66 connected to the amplifier 62. In FIG. 2, this is symbolically illustrated as capacitor 68. From an examination of the physical structure shown in FIG. 2, it is apparent that capacitance 68 would include a component 70 between a conductive pad 72 and a bottom 74 of the substrate 76 of the integrated circuit 44. If the bottom 74 is in contact with a conductive base 78, the total capacitance 68 would effectively be equal to capacitive component 70. The arrangement of FIG. 2 with a conductive base 78 is a preferred embodiment. Other arrangements for capacitively coupling from one side of a diode/junction to the amplifier 62 input line 66 are also included in the spirit of the present invention. It will be clear to those skilled in the art that any construction that places capacitive components in parallel in the path of induced current flow, for example a capacitive in parallel with capacitance 70, will increase the total capacitance, and any construction such as an insulative layer between the bottom 74 of the substrate and the base 78 that places a capacitance in series with capacitance 70 will decrease the total capacitance. It will be understood by those skilled in the art that a larger capacitance from the diode side 64 to a conductive base 78 connected to line 66, or by another path to the line 66 will allow a larger flow of induced current since capacitive reactances are additive in parallel, and the resultant reactance is inversely proportional to the total capacitance. The total effective capacitance between a diode end and a conductive line to the amplifier or other current measuring device will be termed intrinsic "system capacitance".

In order for diode induced current to flow through the system capacitance, it must have an alternating current (AC) component. According to the present invention, the beam 40 is pulsed, preferably in the form of a square wave for maximizing the rise and fall times of the induced current and thereby also the frequency of the alternating (AC) component of the induced current. In this way, the capacitive reactance $\frac{1}{2\pi fC}$ is minimized, allowing a larger flow of induced current.

Figure 3:
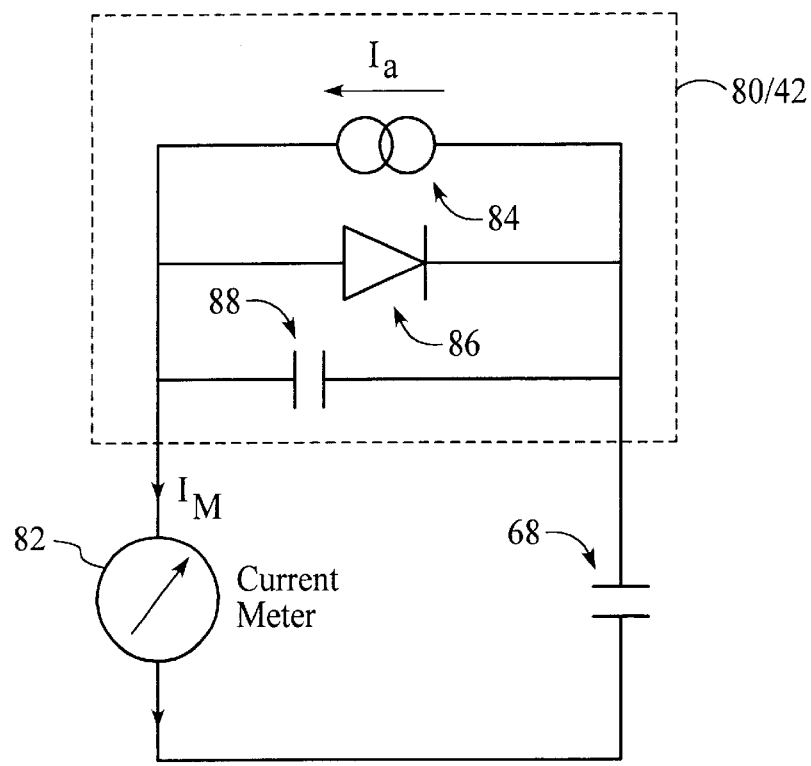
FIG. 3 is an equivalent circuit of a semiconductor junction, current meter and intrinsic system capacitance.

FIG. 3 shows an equivalent circuit 80 of a diode such as diode 42. The current meter 82 as shown represents all of the circuitry for detecting and displaying the induced current, including amplifier 62, signal acquisition circuit 84 (FIG. 2), computer 52 and signal generator 48. The present invention also includes other circuitry for detecting and recording or displaying the induced current that will be apparent to those skilled in the art. The diode 42/circuit 80 is shown to be in series with the total system capacitance 68. The diode equivalent circuit as applied to the process and induced current analysis includes an induced current source 84, an ideal diode 86 and a capacitor 88. A component $I_m$ of the induced current $I_g$ flows through the current meter 82 and capacitance 68 in response to a pulsed beam incident on the diode 42 (FIG. 2).

Figure 4:
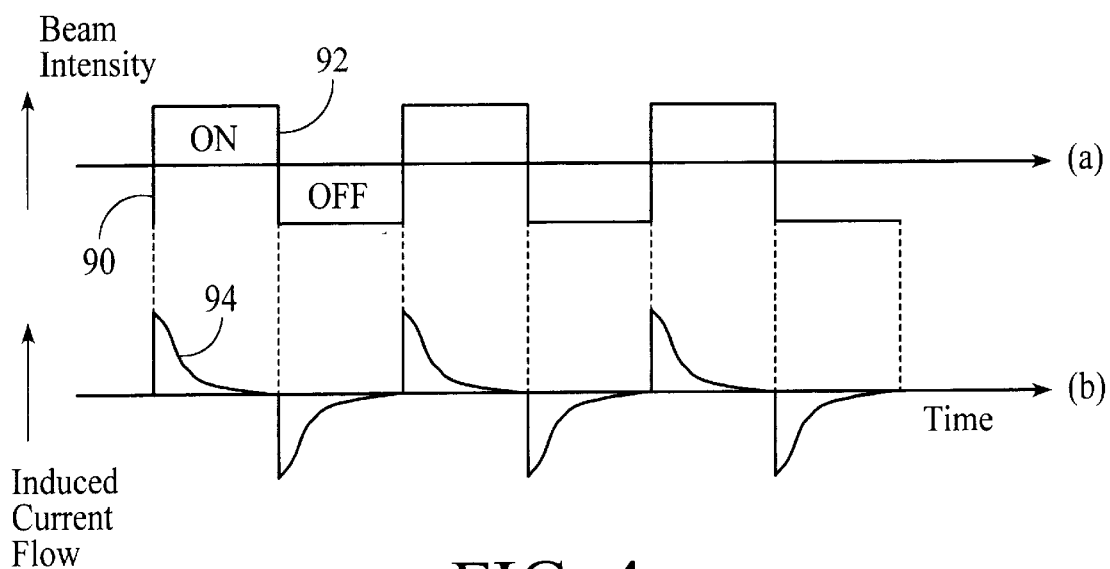

FIG. 4a shows a plot of a preferred light beam intensity as a function of time. The sharp rise time 90 and fall time 92 cause a corresponding rapid change in the induced current flow as shown in FIG. 4b. It should be noted that an increase in the optical beam power results in more induced current being generated, which causes a faster decay and results in a better signal-to-noise ratio at a higher scanning beam rate. The decay shape 94 is largely a function of the system capacitance 68, as well as other reactive current components that will be understood by those skilled in the art.

Figure 5:
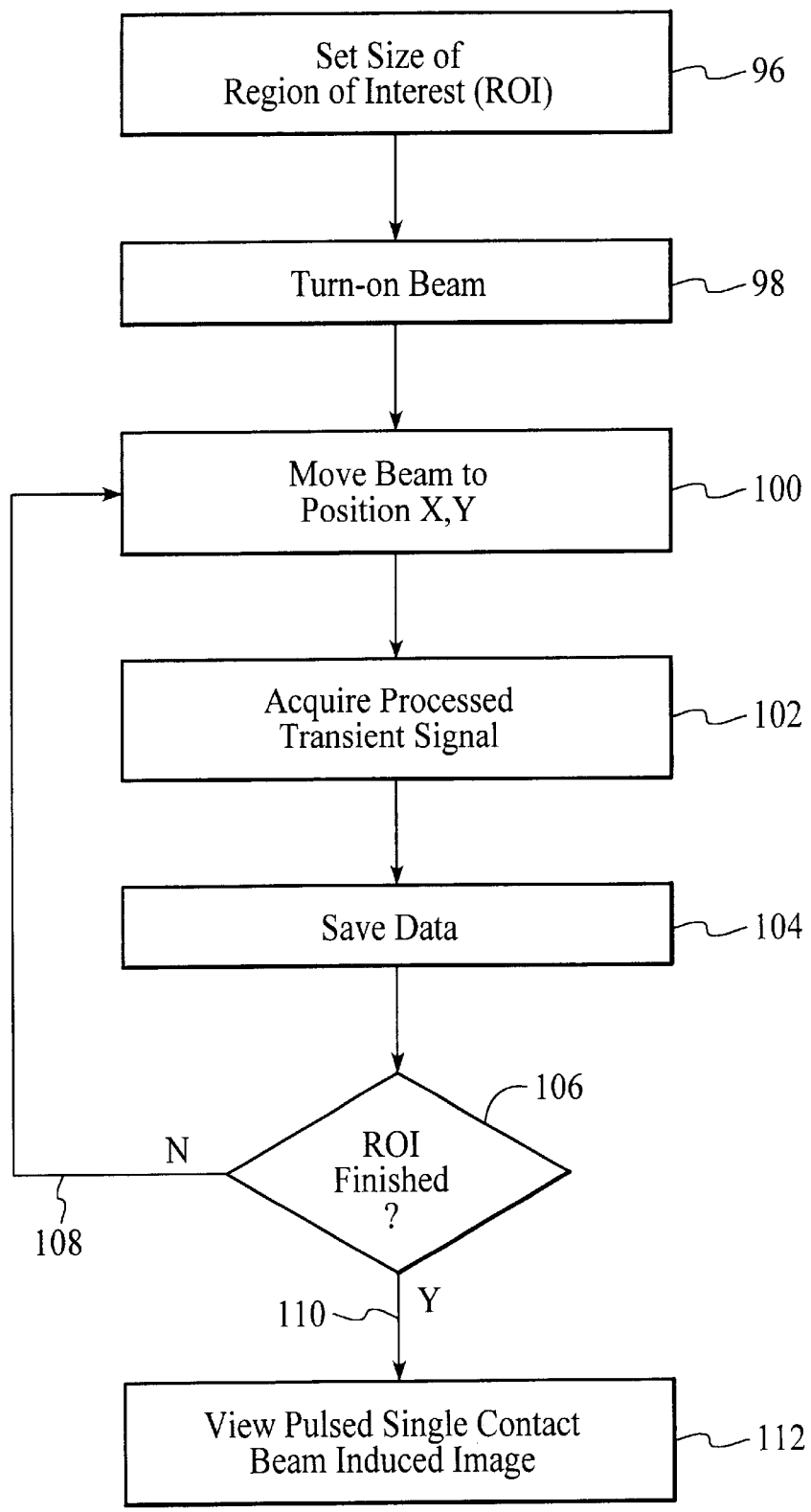
FIG. 5 is a flow chart illustrating the method of the present invention and operation of the corresponding apparatus.

The process of induced pulsed beam current analysis is illustrated in the flow chart of FIG. 5. An operator begins by programming the computer 52 to direct the scan generator 50 to cause the beam generator 38 to sequentially position the beam 40 to the regions of interest, including one or more diodes/junctions (block 96). The signal generator 48 is turned on (block 98) to drive the beam blanker 46 to turn the beam generator on and off, modulating the beam intensity, preferably in a square wave pattern as illustrated in FIG. 4a. The computer 52 then directs the scan generator 50 to drive the beam generator to position the beam at specified coordinates X, Y (block 100) of a diode (junction). The diode under impact of the modulated beam then generates an induced current wave form such as shown in FIG. 4b, the particular shape dependent on the impedance of the current path, including the system capacitance and amplifier 62 impedance. The measurement circuitry, represented as meter 82 in FIG. 3, and including the amp 62, signal acquisition circuit 84 and computer 52, then acquires/measures the induced current (block 102). The computer 52 stores the data representing the induced current (block 104). The amplified induced current can then be analyzed by examining the phase and/or amplitude of the induced signal. If (block 106) other regions of interest (diode junctions) are programmed to be analyzed, i.e. if the regions of interest have not all been analyzed 108, the computer 52 directs the scan generator 50 to direct the beam generator to position the beam on the next diode/junction area of interest. The process of 100 to 108 is repeated until all regions of interest have been analyzed and the data stored. At this point the regions of interest are finished 110, and the computer then displays an image derived from the data, representing the diodes/junctions induced current levels (block 112).

An alternate embodiment of the present invention is also illustrated in FIG. 2 utilizing the equipment and methods described above, but instead of directing the beam at the top side of the circuit, the beam is directed at the bottom side of the circuit, preferably in line with a junction to be analyzed. This is illustrated by dashed line 114 implying that the beam generator 38 is alternatively positioned so as to direct the optical beam at the back side of the integrated circuit 44. The alternate beam is given the item number 40'. A clearance hole (not shown) through the base 78 is provided for passage of the beam 40' for this embodiment. It has been found that directing a beam at the back side of the circuit is effective in generating induced current when the beam has an optical wavelength near the silicon bandgap.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. Apparatus for beam induced current analysis of a semiconductor junction comprising:
   a) an electrical wired contact for connection to a first side of a semiconductor junction on an integrated circuit;
   b) an optical beam generator for application of a pulsed optical beam on said junction; and
   c) measurement apparatus having first and second terminals for input of current generated by said junction to said measurement apparatus, wherein said first terminal is for connection to said electrical contact, and said second terminal is for connection to a second side of said junction through an intrinsic system capacitance, said measurement apparatus for measurement of an induced current generated by said junction in response to said pulsed beam.

2. An apparatus as recited in claim 1 wherein said capacitive connection is a connection to ground and said capacitance is a series capacitance in a circuit between said ground and said second side of said junction.

3. An apparatus as recited in claim 1 wherein said pulsed beam is a beam modulated with a square wave amplitude modulation.

4. An apparatus as recited in claim 1 wherein said measurement apparatus includes
   a) an amplifier for providing an amplified said induced current;
   b) signal acquisition apparatus for creating digital induced current data from said amplified induced current; and
   c) computer apparatus for storing said current data.

5. An apparatus as recited in claim 4 further comprising scanning apparatus responsive to a scan instruction from said computer apparatus for directing said beam generator to position said beam on a selected junction.

6. An apparatus as recited in claim 1 wherein said beam generator includes a beam blanker responsive to a signal generator for turning said beam on and off to create said pulsed beam.

7. An apparatus as recited in claim 1 wherein said second terminal is interconnected to an electrically conductive base upon which said integrated circuit is positioned during said analysis.

8. A method for beam induced current analysis of a semiconductor junction comprising:
   a) making an electrical wired contact to a first side of a semiconductor junction on an integrated circuit;
   b) creating a capacitive connection to a second side of said junction through an intrinsic system capacitance;
   c) applying a pulsed optical beam on said junction with a beam generator; and
   d) measuring an induced current generated by said junction in response to said pulsed beam, said measuring performed using a measurement apparatus having a first terminal connected to said electrical wired contact, and a second terminal connected to said capacitive connection.

9. A method as recited in claim 8 wherein said capacitive connection includes a connection to ground and a capacitance between said ground and said second side of said junction.

10. A method as recited in claim 8 wherein said pulsed beam is a beam modulated with a square wave amplitude modulation.

11. A method as recited in claim 8 wherein said measurement apparatus includes
    a) an amplifier for providing an amplified said induced current;
    b) signal acquisition apparatus for creating digital induced current data from said amplified induced current; and
    c) computer apparatus for storing said current data.

12. A method as recited in claim 11 further comprising directing said beam generator to position said beam on a selected junction, said directing applied by a scanning apparatus responsive to a scan instruction from said computer apparatus.

13. A method as recited in claim 8 wherein said beam generator includes a beam blanker responsive to a signal generator for turning said beam on and off to create said pulsed beam.

14. A method as recited in claim 8 wherein said second terminal is interconnected to an electrically conductive base upon which said integrated circuit is positioned during said analysis.

15. An apparatus as recited in claim 4 wherein said computer apparatus is programmed to analyze said data to determine an amplitude characteristic of said induced current.

16. An apparatus as recited in claim 4 wherein said computer apparatus is programmed to analyze said data to determine a phase characteristic of said induced current.

17. A method as recited in claim 11 wherein said computer apparatus is programmed to analyze said data to determine an amplitude characteristic of said induced current.

18. A method as recited in claim 1 wherein said computer apparatus is programmed to analyze said data to determine a phase characteristic of said induced current.

19. Apparatus for beam induced current analysis of a semiconductor junction comprising:
    a) an electrical wired contact for connection to a first side of a semiconductor junction positioned on a first side of an integrated circuit;

b) an optical beam generator for application of a pulsed optical beam at said second side of said integrated circuit; and c) measurement apparatus having first and second terminals for input of current generated by said junction to said measurement apparatus, wherein said first terminal is for connection to said electrical contact, and said second terminal is for connection to a second side of said junction through an intrinsic system capacitance, said measurement apparatus for measurement of an induced current generated by said junction in response to said pulsed beam.

20. A method for beam induced current analysis of a semiconductor junction comprising:

a) making an electrical wired contact to a first side of a semiconductor junction positioned on a first side of an integrated circuit;

b) creating a capacitive connection to a second side of said junction through an intrinsic system capacitance;

c) applying a pulsed optical beam at a second side of said integrated circuit; and d) measuring an induced current generated by said junction in response to said pulsed beam, said measuring performed using a measurement apparatus having a first terminal connected to said electrical wired contact, and a second terminal connected to said capacitive connection.

21. An apparatus as recited in claim 19 wherein said optical beam has a wavelength near a silicon bandgap.

22. A method as recited in claim 20 wherein said optical beam has a wavelength near a silicon bandgap.

* * * * *

UNITED STATES PATENT AND TRADEMARK OFFICE
CERTIFICATE OF CORRECTION

PATENT NO. : 6,556,029 B1
DATED : April 29, 2003
INVENTOR(S) : Chin Jiann Min et al.

It is certified that error appears in the above-identified patent and that said Letters Patent is hereby corrected as shown below:

<u>Column 6,</u>
Line 59, reading "18. A method as recited in claim 1, wherein said computer" should read -- 18. A method as recited in claim 11, wherein said computer --.

Signed and Sealed this

Seventeenth Day of February, 2004

JON W. DUDAS
*Acting Director of the United States Patent and Trademark Office*